(12) United States Patent
Durham et al.

(10) Patent No.: US 6,577,152 B1
(45) Date of Patent: Jun. 10, 2003

(54) NOISE SUPPRESSION CIRCUIT FOR SUPPRESSING ABOVE-GROUND NOISES

(75) Inventors: Christopher McCall Durham, Round Rock, TX (US); Peter Juergen Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/322,040

(22) Filed: May 28, 1999

(51) Int. Cl.[7] ............................................. H03K 17/16
(52) U.S. Cl. ............................... 326/21; 326/23; 326/24
(58) Field of Search ............................ 326/21–28, 82, 326/83

(56) References Cited

U.S. PATENT DOCUMENTS 5,926,050 A * 7/1999 Proebsting .................. 327/170
6,335,638 B1 * 1/2002 Kwong et al. ................ 326/83

* cited by examiner

*Primary Examiner*—Michael Tokar
*Assistant Examiner*—Anh Q. Tran
(74) *Attorney, Agent, or Firm*—Casimer K. Salys; Bracewell & Patterson, L.L.P.

(57) ABSTRACT

A noise suppression circuit for suppressing above-ground noise is disclosed. The noise suppression circuit for suppressing noises includes a first inverter, a second inverter, and a one-shot circuit. The first inverter, connected to an input line, switches at a first voltage value above which a noise-coupling event is suspected. The second inverter, also connected to the input line, switches at a second voltage value above which a full-switch input is assumed. A first transistor is coupled to the input line. A second transistor passes an output of the second inverter to a gate of the first transistor when an output of the one-shot circuit is high. The third transistor holds the gate of the first transistor low when the output of the one-shot circuit is low.

11 Claims, 3 Drawing Sheets

NOISE SUPPRESSION CIRCUIT FOR SUPPRESSING ABOVE-GROUND NOISES

BACKGROUND OF THE INVENTION

1. Technical Field

The present invention relates to electronic circuits in general, and in particular to noise suppression circuits. Still more particularly, the present invention relates to a noise suppression circuit for suppressing above-ground noises.

2. Description of the Prior Art

It is widely accepted that standard complementary metal oxide semiconductor (CMOS) static circuits are noise immune, but perform at a relatively slow speed. Thus, for speed-critical circuits, most circuit designers will turn to dynamic techniques that can provide better speed performance. However, one drawback with dynamic circuits is that they usually have a relatively low noise immunity.

For integrated circuits, noise generally comes from two primary sources. The first source is a DC offset between a source and sink circuits, which is commonly referred to as a "ground offset." The exact value of the ground offset is determined by the locality of neighboring circuits and their power requirements. Because of the complexity of determining the ground offset value on a per-circuit basis, it is assumed to be a constant across the entire integrated circuit, correlated to the worst-case possible scenario.

The second source of integrated noise arises from neighboring signal lines, and such noise is commonly known as coupling noise. Coupling noise is injected in a three-dimensional manner; that is, horizontally adjacent as well as vertically adjacent neighbors can inject coupling noise onto a signal line. In most circuit designs, vertically adjacent planes are routed in an orthogonal manner, which virtually eliminates most, if not all, vertical coupling problems. Thus, horizontal adjacent switching neighbors are usually the remaining concern for most circuit designs.

Noise injection from a horizontally adjacent neighbor occurs when a signal line is held at a constant voltage, and the adjacent neighbor transitions from the same state as the signal line being held, to an opposite state. Because all the lines are related in a capacitive manner due to the verticality of the lines, the above-mentioned transition induces a drop in the held signal line as well. Furthermore, each side of the signal line may have a neighbor, and each neighbor may be split into multiple signals across the full length of the signal line in question. This situation is a far worse situation than a single consistent neighbor. In other words, each neighboring signal may transition at such a time that an aggregation of injected noise can occur. As a result, a longer and relatively stronger noise injection pulse is formed.

A simple method to reduce or eliminate noise injected by horizontal neighbor signal wires is to relocate the affecting neighbor signal wires. However, this may not be a possible solution if space is a constraint. Another method is to move the source and sink circuits closer together to reduce wire lengths, thus reducing coupling lengths. However, this solution may not be possible because any movement of one circuit nearly always adversely affects another circuit. Yet another method that can be employed is to increase the noise margin of the receiving circuit. However, doing so may mean a large re-design effort and/or a reduction in circuit performance. Consequently, there exists a need to provide an improved method for reducing coupling noise, and in particular coupling noise induced by low-going-high signal transitions. This is because reduction of coupling noise should not require extensive movement of circuits or wires, and should not adversely impact the performance of the integrated circuit.

SUMMARY OF THE INVENTION

In accordance with a preferred embodiment of the present invention, a noise suppression circuit for suppressing noises includes a first inverter, a second inverter, and a one-shot circuit. The first inverter, connected to an input line, switches at a first voltage value above which a noise-coupling event is suspected. The second inverter, also connected to the input line, switches at a second voltage value above which a full-switch input is assumed. A first transistor is coupled to the input line. A second transistor passes an output of the second inverter to a gate of the first transistor when an output of the one-shot circuit is high. The third transistor holds the gate of the first transistor low when the output of the one-shot circuit is low.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
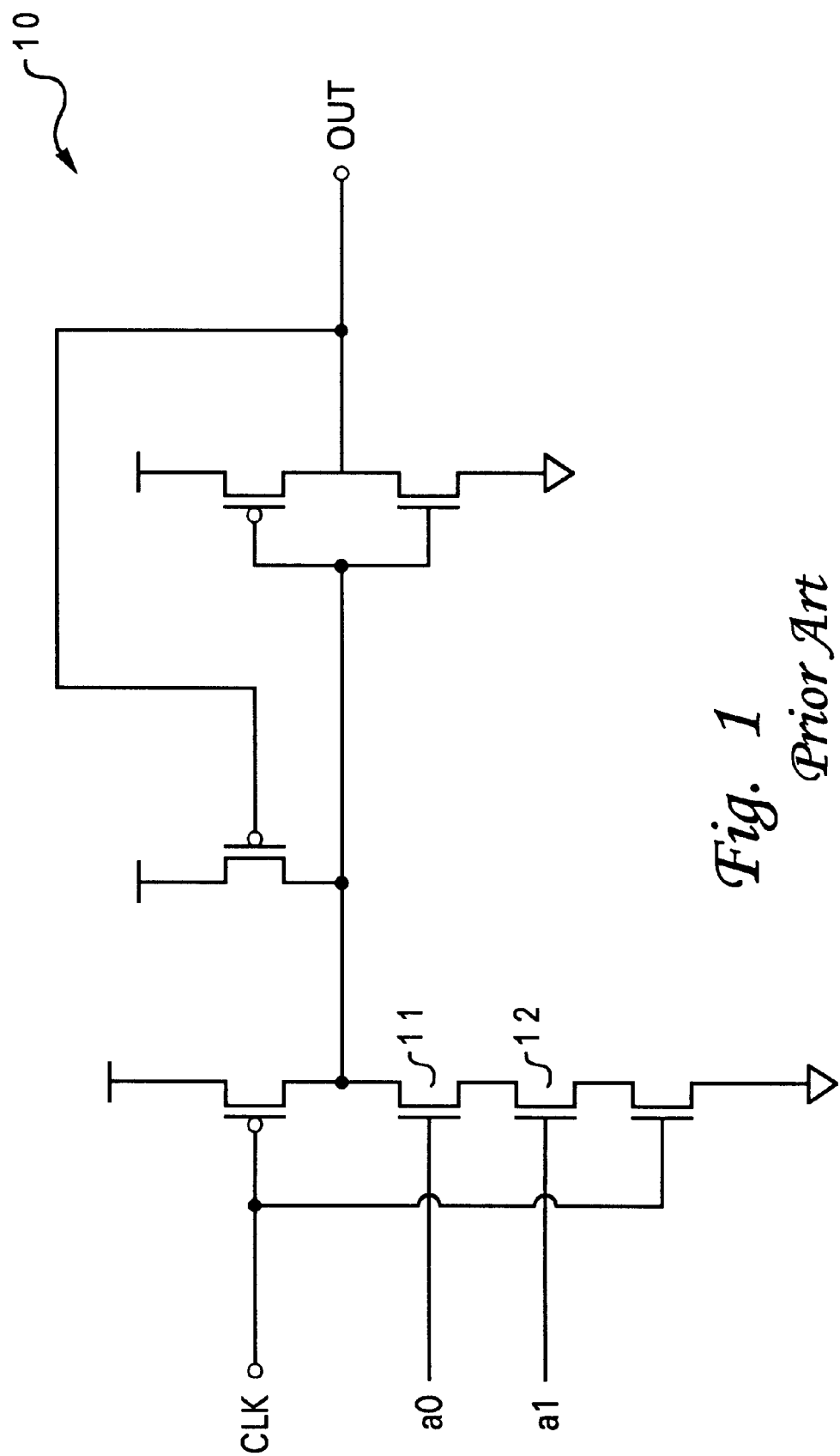
FIG. 1 is a schematic diagram of a conventional domino circuit.

Referring now to the drawings and in particular to FIG. 1, there is illustrated a schematic diagram of a conventional domino circuit. Output OUT of domino circuit 10 will transition high while clock CLK is high when both logical inputs a0 and a1 turn on their respective n-channel transistors 11 and 12. Typically, the noise margin of domino circuit 10 is about 20% to 30% of the power supply voltage, which is much lower than the switching voltage of an even-ratioed static circuit that has a noise margin of about 50% of the power supply voltage. In addition, domino circuits, such as domino circuit 10, are sensitive to low-going-high input noise or noise coupling.

Figure 2:
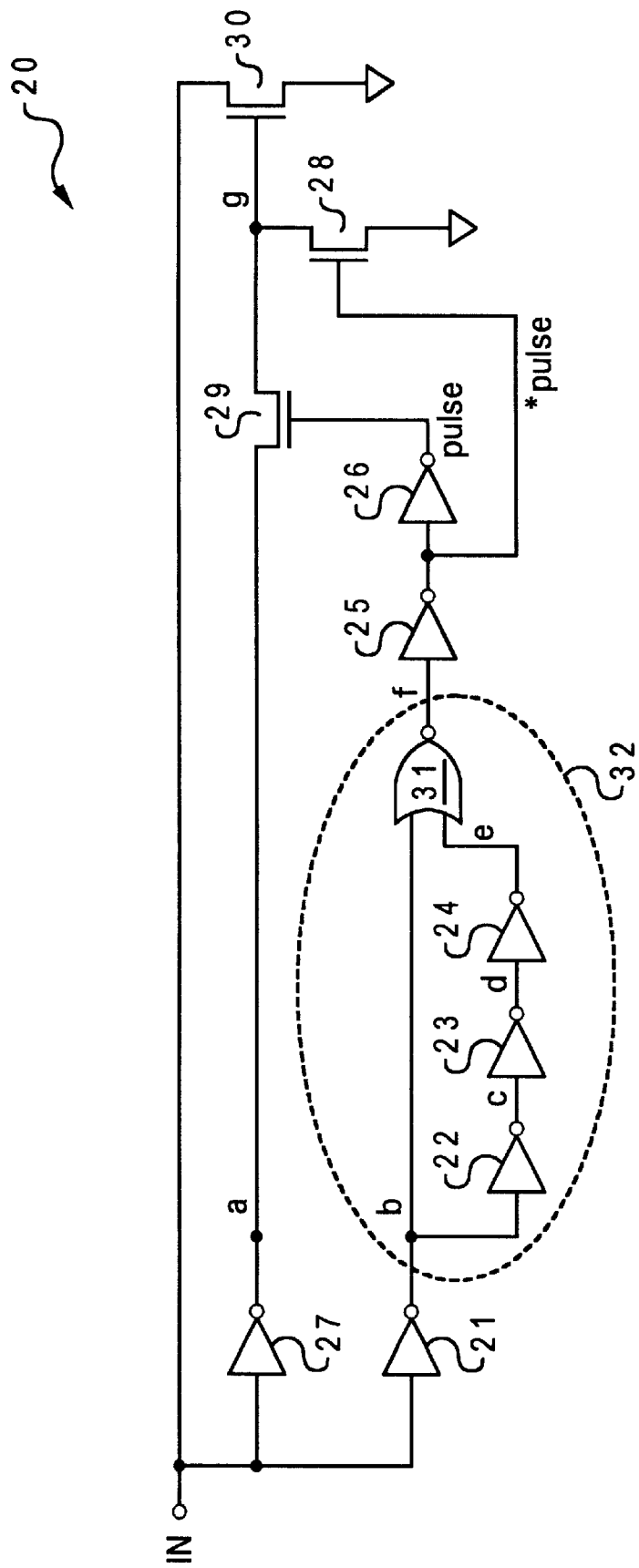
FIG. 2 is a schematic diagram of an active noise suppression circuit, in accordance with a preferred embodiment of the present invention.

In order to counteract the problem of noise injection, an active noise suppression circuit can be coupled to a signal line having a noise problem. With reference now to FIG. 2, there is illustrated a schematic diagram of an active noise suppression circuit, in accordance with a preferred embodiment of the present invention. As shown, noise suppression circuit 20 includes inverters 21–27, n-channel transistors 28–30, and a two-input NOR gate 31. Input IN of noise suppression circuit 20 is to be connected to a signal line having noise problems, such as inputs a0 and a1 of FIG. 1.

Inverter 21 is designed to switch at a minimum trigger voltage value $V_{min}$, the minimum voltage value of a detectable noise-coupling event; and inverter 27 is designed to switch at a maximum trigger voltage value $V_{max}$, which is the maximum voltage of a detectable noise-coupling event and is the voltage value above which a full-switch of an input signal is assumed to be occurring. Of course, $V_{max}$ is greater than $V_{min}$. Inverters 22–24 and NOR gate 31 together form a falling-edge triggered one-shot circuit 32. A pulse will be generated at the output, i.e, node f, of one-shot circuit 32 when an input, such as node b, of one-shot circuit 32 falls. Inverter 25 serves not only to slightly delay the pulse created by the one-shot circuit but also to logically invert the pulse for driving transistor 28. Inverter 26 slightly delays the output of inverter 25, and also inverts the output of inverter 25 to drive transistor 29. Transistor 29 passes the output of inverter 27 to the gate of transistor 30 when the output of inverter 26 is high. Thus, transistor 30 is selectively turned on by transistor 29 to help pulling input IN low. On the other hand, transistor 28 holds node g low while the one-shot circuit is inactive.

During operation, when input IN is at a steady-state low, nodes a and b are forced high. When node b is high, node e becomes low. When node b is high and node e is low NOR gate 31 is forced to drive node f low. When node f is low, node *pulse becomes high, turning transistor 28 on. Node *pulse high forces node pulse low, turning off transistor 29. When transistor 28 is on and transistor 29 is off, node g is forced low, turning off transistor 30.

At time t, when input IN transitions above $V_{min}$, but is still less than $V_{max}$ (meaning there is an occurrence of a noise-coupling event), node a remains high, but node b is forced low. When node b and node e have low states, node f transitions high. Node f remains high until node e is driven high, as determined by the delay of inverters 22–24, $t_p$. Thus, this pulse at node f is a positive-active pulse generated by the falling edge of node b having a pulse width of $t_p$. Node *pulse has the inverse of polarity node f, and node pulse has the same polarity as node f. The rising edge of the pulse occurs at time $t+t_o$, where time to is determined by the delay through NOR gate 31 and transistors 25, 26. Node *pulse having a low state turns off transistor 28, while node pulse having a high state turns on transistor 29.

Figure 3:
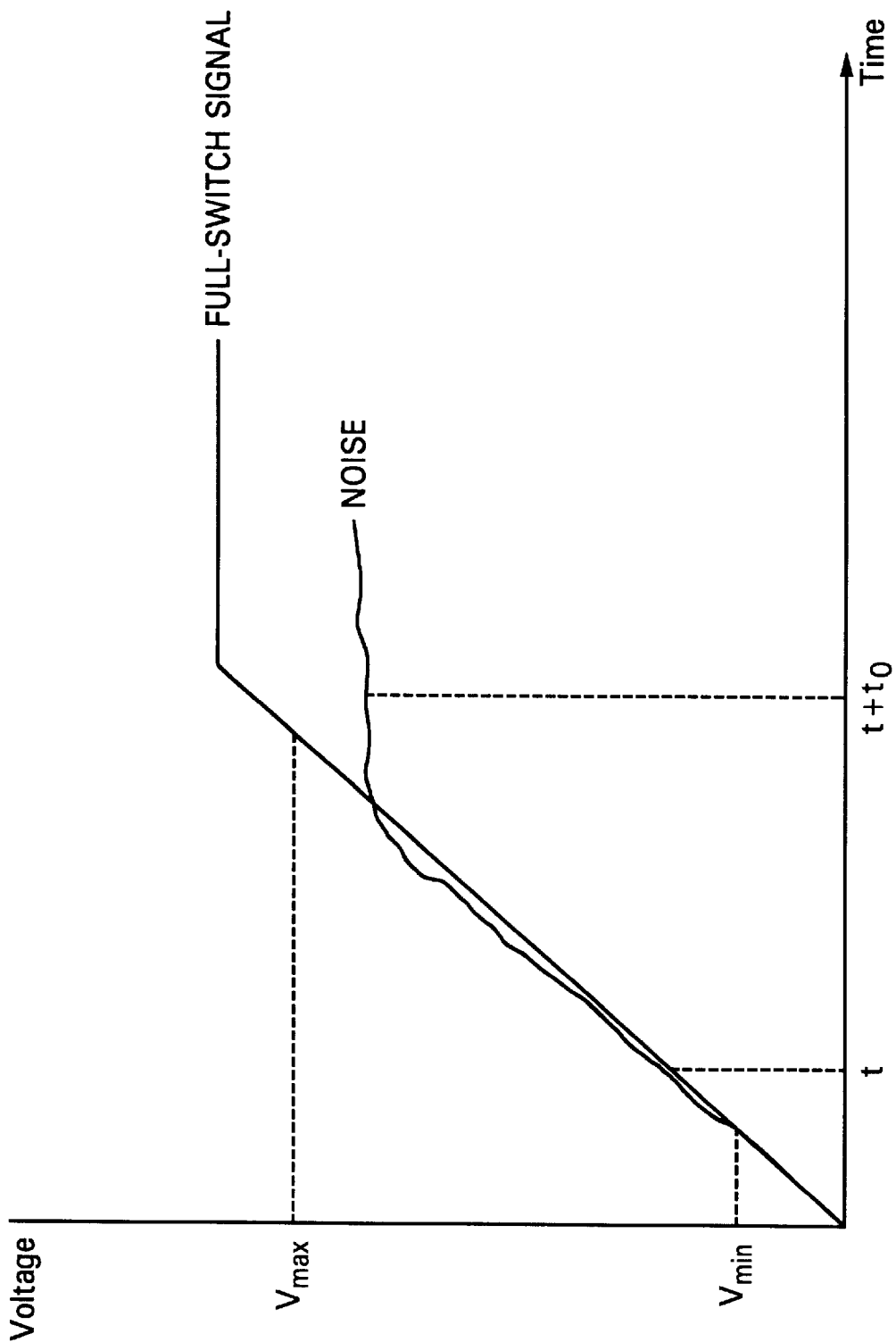
FIG. 3 is a waveform diagram illustrating a timing comparison between a full-switch signal and noise.

At time $t+t_o$, as shown in FIG. 3, if input IN is above $V_{max}$ (meaning a full-switch of a signal has occurred at input IN), then node a is low as the switching point of inverter 27 has been reached. The input "signal pulse" then connects node a to node g (because transistor 29 is on). Because node a is low, node g remains low and transistor 30 remains off. However, if input IN is below $V_{max}$ at time $t+t_o$ (meaning a full-switch of a signal has not occurred at input IN), then node a remains high because the switching point of inverter 27 has not been reached. The input "signal pulse" then connects node a to node g (because transistor 29 is on). At this point, the n-channel transistor inside inverter 27 does not have to "fight" against transistor 28 because transistor 28 is off by virtue of node *pulse being low. Transistor 30 turns on for a time $t_p$, which makes the width of the pulse also $t_p$, and pulls (or helps to pull) input IN back to ground. After time $t_p$ has expired, node pulse returns to a low state, and node *pulse returns to a high state. This condition turns off transistor 29 and turns on transistor 28, forcing node g low, which turns off transistor 30.

When input IN transitions from high to low, node b transitions from low to high. Node e transitions from high to low after a small time delay $t_q$. Node f remains low, and no pulse will be generated by the one-shot circuit when at least one input of NOR gate 31 is high.

The result of the above-described operation is that input IN (of a circuit that is prone to noise-coupling events) is continually monitored by circuit 20 to detect input signal at input IN rising above voltage $V_{min}$. If an input signal switch above $V_{min}$ is observed, then after a time lapse of $t_o$, the value of input IN is sampled again. If the value of input IN is above $V_{max}$ at this time, circuit 20 does nothing. However, if the value of input IN is below $V_{max}$, then circuit 20 suspects a noise-coupling event is occurring and pulls (or helps to pull) input IN low.

There are several key design points that are crucial to circuit 20. The value of the minimum trigger voltage value $V_{min}$ can be controlled by the p-channel transistor to n-channel transistor ratio of inverter 21. Thus, $V_{min}$ can be adjusted for each circuit as desired. Likewise, the value of the maximum trigger voltage value $V_{max}$ can be controlled the p-channel transistor to n-channel transistor ratio of inverter 27. Thus, $V_{max}$ can also be easily adjusted to suit each circuit's needs.

In addition, the time delay before the sampling of the input for switching (i.e., time delay $t_o$) must be set at such a time that the input signal at input IN will have passed $V_{max}$. In other words, the rise time of the input signal should be less than the time to get to $V_{max}$. This time is easily adjustable using NOR gate 31 and inverters 25, 26. Note that additional delay can be introduced, if necessary, by adding an even number of inverters between NOR gate 31 and inverter 25.

Furthermore, the pulse width $t_p$ should be sufficient to pull input IN low (or low enough) to be of importance. This can be easily set by adjusting the delays within inverters 22–24, or by adding more pairs of inverters. Circuit 20 does add a small amount of loading to the input IN node. The loading is caused by inverters 21 and 27 and the diffusion capacitance of transistor 30. These values should be kept very small to reduce any unwanted effects.

As has been described, the present invention provides an active noise suppression circuit that monitors the voltage on an input signal line and reacts to any suspected noise events, thus reducing or even eliminating the injected noise. The active noise suppression circuit loads down the input signal line very slightly while responding to detected noise-coupling events in such a manner to reduce or eliminate any low-to-high noise. This operation is triggered if the input signal transitions above a minimum trigger voltage value $V_{min}$ and does not subsequently transition above a maximum trigger voltage value $V_{max}$ in a short period of time $t_o$. If the input signal stays above $V_{min}$ and below $V_{max}$ after time $t_o$, then the active noise suppression circuit is activated to reduce the noise at the input signal line.

While the invention has been particularly shown and described with reference to a preferred embodiment, it will be understood by those skilled in the art that various changes in form and detail may be made therein without departing from the spirit and scope of the invention.

What is claimed is:

1. A noise suppression circuit, comprising:
   a first inverter connected to an input line, wherein said first inverter switches at a first predetermined voltage, wherein said first predetermined value is a minimum voltage of a detectable noise-coupling event;
   a second inverter connected to said input line, wherein said second inverter switches at a second predetermined voltage above which a full-switch input signal is expected;
   an one-shot circuit coupled to said second inverter; and
   a plurality of transistors for actively pulling said input line to ground when an output of said one-shot circuit is high.

2. The noise suppression circuit according to claim 1, wherein said one-shot circuit is a fall-edge triggered one-shot circuit.

3. The noise suppression circuit according to claim 1, wherein said one-shot circuit includes a two-input NOR gate and a plurality of inverters.

4. The noise suppression circuit according to claim 1, wherein said plurality of transistors includes a first transistor coupled to said input line, a second transistor passes an output of said second inverter to a gate of said first transistor when an output of said one-shot circuit is high, and a third transistor holds said gate of said first transistor low when said output of said one-shot circuit is low.

5. The noise suppression circuit according to claim 4, wherein said first transistor is an n-channel transistor.

6. The noise suppression circuit according to claim 4, wherein said second transistor is an n-channel transistor.

7. The noise suppression circuit according to claim 4, wherein said third transistor is an n-channel transistor.

8. The noise suppression circuit according to claim 1, wherein said noise suppression circuit is coupled to a circuit having an input that is prone to noise-coupling.

9. A method for suppressing a noise-coupling event from a circuit, said method comprising the steps of:

detecting whether or not an input signal at an input of said circuit is above a first predetermined voltage;

in response to a detection of an input signal at said input of said circuit is above said first predetermined voltage, detecting whether or not said input signal is above a second predetermined voltage after a short time lapse; and in response to a detection of said input signal is not above said second predetermined voltage after said short time lapse, actively pulling said input signal to ground.

10. The method according to claim 9, wherein said first predetermined voltage is a minimum voltage of a detectable noise-coupling event.

11. The method according to claim 9, wherein a full-switch input signal is expected to be above said second predetermined voltage.

\* \* \* \* \*